United States Patent [19]

Kasperkovitz et al.

[11] Patent Number: 4,639,679
[45] Date of Patent: Jan. 27, 1987

[54] FREQUENCY-DOUBLING CIRCUIT

[75] Inventors: Wolfdietrich G. Kasperkovitz; Herman W. Van Rumpt, both of Eindhoven, Netherlands

[73] Assignee: U.S. Philips Corporation, New York, N.Y.

[21] Appl. No.: 671,151

[22] Filed: Nov. 13, 1984

[30] Foreign Application Priority Data

Nov. 10, 1983 [NL] Netherlands ............... 8303855

[51] Int. Cl.[4] ............................................. H03K 1/16
[52] U.S. Cl. .................................. 328/20; 328/160;
328/15; 307/529; 307/494; 307/271
[58] Field of Search ............... 307/529, 525, 271, 494,
307/498; 328/15, 160, 133, 156, 20

[56] References Cited

U.S. PATENT DOCUMENTS 2,440,465  4/1948  Ferguson ........................ 328/23
3,710,146  1/1973  Ohsawa ........................... 307/271
3,764,927  10/1973  Allinger et al. .............. 329/104

Primary Examiner—Stanley D. Miller
Assistant Examiner—Richard Roseen
Attorney, Agent, or Firm—Thomas A. Briody; William J. Streeter; Leroy Eason

[57] ABSTRACT

A frequency doubling circuit for doubling the fundamental frequency of a signal wave, comprising a pair of full-wave rectifier circuits which produce output signals which are subtracted to derive the second harmonic of the fundamental frequency. The direct current component and unwanted harmonics produced by the rectifier circuits are suppressed by capacitive loading which establishes a phase-quadrature relationship between the fundamental signal waves applied to both rectifier circuits, and adaptively maintaining the amplitudes of the fundamental frequency signals produced thereby equal by means of a negative feedback gain control loop.

7 Claims, 3 Drawing Figures

FREQUENCY-DOUBLING CIRCUIT

BACKGROUND OF THE INVENTION

1. Field Of The Invention

The invention relates to a frequency-doubling circuit for doubling the frequency of a fundamental wave, comprising first and second full-wave rectifier circuits to which the fundamental wave is applied in a mutual phase-quadrature relationship and whose output signals are subtracted from each other to obtain the second harmonic of the fundamental wave.

2. Description Of The Related Art

Such a frequency-doubling circuit is disclosed in U.S. Pat. No. 2,440,465.

Because of the phase-quadrature relationship between the input fundamental waves of the two rectifier circuits, the desired second harmonic of the fundamental wave occurs in the output signals of these rectifier circuits with mutually opposite phases and the unwanted d.c. component and the $4K^{th}$ ($K=1, 2, 3, \ldots$) harmonics occur with mutually equal polarities and phases respectively. By forming the difference between the two output signals, the desired second harmonic of the fundamental wave in each of the two output signals are added together, whilst said unwanted d.c. and higher-order distortion components of one output signal are compensated for by the components of the other output signal.

However, amplitude differences between the output signals of the two rectifier circuits reduce both the efficiency and the distortion compensation. Such amplitude differences occur more specifically when the fundamental wave whose frequency is to be doubled may vary over a comparatively large frequency range, for example when the frequency-doubling circuit is used in a radio or television tuning unit.

SUMMARY OF THE INVENTION

The invention has for its object to provide a frequency-doubling circuit in which such amplitude differences do not occur, or at least to a much lesser extent than in the prior art frequency-doubling circuit.

According to the invention, a frequency-doubling circuit of the type set forth in the opening paragraph, is characterized in that an input of the first full-wave rectifier circuit corresponds to an input of a first variable-gain amplifier arrangement an output of which is capacitively loaded for a 90° phase shift of the fundamental wave and is coupled to the second full-wave rectifier circuit, the input and output of the first variable-gain amplifier arrangement being coupled via respective first and second amplitude detectors to a differential input of a difference stage, an output of which is coupled to a control input of the first variable-gain amplifier arrangement for adaptively controlling its gain factor to unity at the fundamental frequency.

The output signal amplitudes of the two rectifier circuits are kept equal to each other by keeping the amplitudes of the two input fundamental waves equal to each other. This is accomplished in that the gain factor of the first variable-gain amplifier arrangement is adaptively stabilized at a value equal to one, at least at the fundamental frequency. Any deviation therefrom—for example due to fluctuations in the capacitive load in response to, for example, ambient factors or tolerance inaccuracies—produces a difference signal at the output of the differential stage, which controls the gain factor of the amplifier arrangement to the initial value one and consequently eliminates the deviation.

A preferred embodiment of the frequency-doubling circuit according to the invention is characterized in that a second variable-gain amplifier arrangement is provided, which is arranged between the output of the first variable-gain amplifier arrangement and the second amplitude detector and whose output is capacitively loaded for a further 90°-phase shift of the fundamental wave, the differential stage being connected via a low-pass filter to both the control input of the first variable-gain amplifier arrangement and to a control input of the second variable-gain amplifier arrangement for an adaptive control of the gain factors of the two amplifier arrangements to unity at the fundamental frequency.

Since fundamental waves applied to the two amplitude detectors have mutually opposite phases an instantaneous amplitude detection and difference formation is possible. Integration of the gain control signal is accomplished by means of merely one low-pass filter provided between the differential stage and the control inputs of the two amplifier arrangements.

A further preferred embodiment of such a frequency-doubling circuit is characterized in that the first variable-gain amplifier and the second variable-gain amplifier each comprise a balanced pair of transistors in long-tail configuration, whose common emitter lead incorporates a current source which is controlled by said differential stage, the common emitters of each balanced pair of transistors forming an output for applying a full-wave rectified fundamental wave to a differential output of a further differential stage, which is coupled to the emitter output of the respective two pairs of transistors, the balanced pair of transistors of the first variable-gain amplifier arrangement being arranged in cascade with the pair of transistors of the second variable-gain amplifier arrangement, these two pairs of transistors having capacitive input and output impedances.

A simple, balanced structure of the frequency-doubling circuit is thereby achieved, which is perfectly suitable for integration.

In a still further embodiment of such a frequency-doubling circuit a further reduction of the harmonic distortion owing to third and higher odd harmonics in the output signal of the frequency-doubling circuit is obtained by an at least partial selection of the fundamental wave in an input stage which precedes the first full-wave rectifier circuit and is capacitively loaded thereby.

So as to linearize the detection characteristic of the two amplitude detectors and to arrange it symmetrically around a predetermined reference amplitude of the fundamental waves applied to the detectors, a still further embodiment of a frequency-doubling circuit according to the invention is characterized in that the input stage comprises a balanced pair of transistors in long-tail configuration, and also, incorporated in the common emitter lead, a current source which is controlled by the first-mentioned difference stage, this balanced pair of transistors and that in the second full-wave rectifier circuit being coupled to the first and second amplitude detectors, respectively via collector outputs, the collectors of each of the two last-mentioned pairs of transistors being coupled to a balanced resistor bridge comprising two mutually equal, divided collector resistors, each comprising two serially connected resistor parts, the common connection of the resistor parts of the one collector resistor being connected to the one of the other collector resistor through a bridging resistor, which is divided into equal portions, the centre tap between those portions of the bridge resistance being coupled via a level output to an input of a differential amplifier which is included in the amplitude detector being coupled to the relevant pair of transistor for arranging the detection characteristic of the amplitude detector symmetrically around a reference value determined by the voltage at the centre tap.

Another, further preferred embodiment of a frequency-doubling circuit according to the invention is characterized by a direct current negative feedback loop from the signal output of the second full-wave rectifier circuit to the input of the first full-wave rectifier circuit.

The use of this measure prevents unbalance in the setting of the balanced circuits of the frequency-doubling circuit.

BRIEF DESCRIPTION OF THE DRAWINGS

The invention will now be described in greater detail by way of example with reference to the Figures shown in the accompanying drawing.

Therein.

DESCRIPTION OF THE PREFERRED EMBODIMENTS

Figure 1:
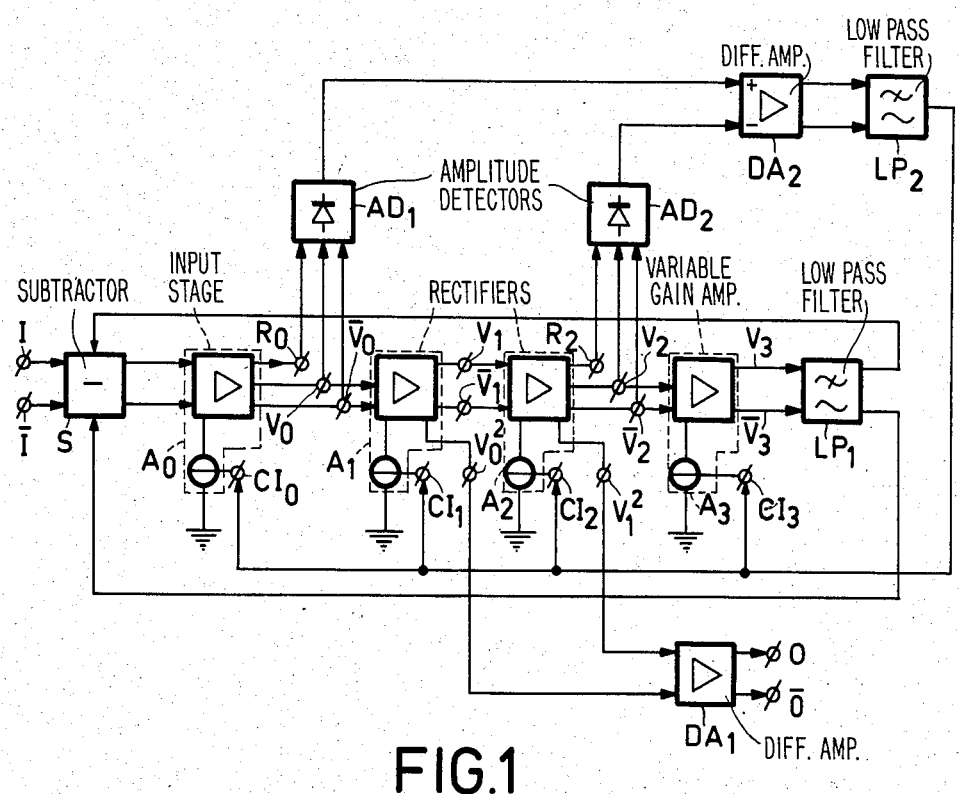
FIG. 1 shows a frequency-doubling circuit according to the invention.

FIG. 1 shows a frequency-doubling circuit according to the invention, having a balanced input I, $\bar{I}$ to which there are connected in cascade: a subtracting stage S for direct current negative feedback still further to be described, a controllable input stage $A_0$ having a control input $CI_0$, balanced signal outputs $V_0$, $\bar{V}_0$ and a level output $R_0$, first and second full-wave rectifier circuits $A_1$ and $A_2$, respectively having respective control inputs $CI_1$ and $CI_2$, rectifier outputs $V_0^2$ and $V_1^2$ and balanced signal outputs $V_1$, $\bar{V}_1$ and $V_2$, $\bar{V}_2$, this second full-wave rectifier circuit $A_2$ also having a level output $R_2$. A variable-gain amplifier arrangement $A_3$ connected to rectifier circuit $A_2$ has a control input $CI_3$ and balanced signal outputs $V_3$, $\bar{V}_3$ which, to provide said direct current negative feedback, are fed back to inverting inputs of the subtracting stage S via a low-pass filter $LP_1$. The rectifier outputs $V_0^2$ and $V_1^2$ are coupled to a differential input of a difference stage $DA_1$, which supplies the desired second harmonic of the fundamental wave in the balanced form to output terminals O, $\bar{O}$ of the frequency-doubling circuit.

Figure 2:
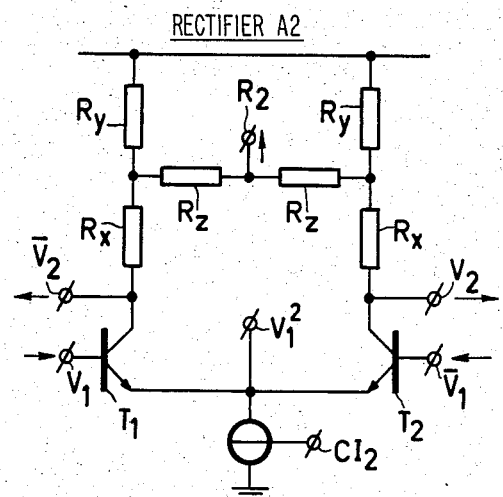
FIG. 2 shows a full-wave rectifier circuit for use in the frequency-doubling circuit according to the invention.

In the embodiment shown the circuits of the controllable input stage $A_0$, those of the first and second full-wave rectifier circuits $A_1$ and $A_2$ and those of the variable-gain amplifier arrangement $A_3$ are fundamentally the same. By way of example, FIG. 2 shows the circuit arrangement of the second full-wave rectifier circuit $A_2$, whose terminals have been given the same reference numerals as those in FIG. 1. This circuit comprises a balanced pair of transistors $T_1$, $T_2$ in a long-tail configuration with a controllable current source incorporated in the common emitter lead and a balanced resistance bridge $R_x$-$R_z$ in the collector leads. The controllable current source has the control input $CI_2$ and the common emitter lead is coupled to the rectifier output $V_1^2$. The signal input $V_1$, $\bar{V}_1$ are applied to the bases of $T_1$ and $T_2$ and the signal outputs $V_2$, $\bar{V}_2$ are produced at the collectors. The resistance bridge $R_x$-$R_z$ comprises two collector resistors ($R_x$, $R_y$) each comprising two serially connected resistor parts $R_x$ and $R_y$, the common connection of the resistor parts of each collector resistor being connected to the common connection of the resistor parts of the other collector resistor through a bridge resistor $2R_z$, constituted by two equal $R_z$ portions. At the centre tap of the bridge resistor $2R_z$ is supplied the level output $R_2$, which is a d.c. voltage the value of which is determined by the bias or quiescent currents through $T_1$ and $T_2$, in-phase or what are commonly denoted "common mode" faults in the balanced input signals $V_1$, $\bar{V}_1$, any DC offset in the biasing of $T_1$ and $T_2$, and the resistance ratio between $R_x$ and $R_y$.

The circuit shown acts upon inputs, $V_1$, $\bar{V}_1$ to produce outputs $V_2$, $\bar{V}_2$, and operates as a variable-gain amplifier arrangement. The signal gain depends, as is well known, on the magnitude of the emitter tail current. That current is controllable by means of the control signal via the control input $CI_2$ of the controllable current source in the common emitter lead. The collector resistors $R_x$, $R_y$ of the pair of transistors $T_1$, $T_2$ form together with intrinsic parasitic collector capacitances (not shown) and the input capacitance of the subsequent circuit coupled to the collectors, a RC-network which is predominantly of the first order. As the frequency of the fundamental wave is much higher than the cross-over frequency of this RC-network, it is subjected to a predominantly 90°-phase shift. Consequently the circuit shown also functions as a 90°-phase shifter.

When the pair of transistors $T_1$, $T_2$ is properly biased, one transistor is in a conducting state in the positive half of a period of the fundamental wave and the other transistor is cut-off and this situation is reversed in the negative half of the period of the fundamental wave. Consequently, the circuit shown functions from the input $V_1$, $\bar{V}_1$ to the common emitter lead also as a full-wave rectifier circuit. It is obvious that then the gain from the input $V_1$, $\bar{V}_1$ to the signal output $V_2$, $\bar{V}_2$ is directly associated with and, at a variation of the emitter tail current, varies in the same direction as the gain from the input $V_1$, $\bar{V}_1$ to the common emitter lead which is coupled to rectifier output $V_1$.

In the circuit of the controllable input stage $A_0$ the signal at the common emitter lead of the pair of transistors is not utilized and the emitter lead is not coupled to an output terminal. In the circuit of the first full-wave rectifier circuit $A_1$ the bridge resistor $2R_z$ and a level output are not present and the collector resistors are not divided, which also applies to the circuit of the variable gain amplifier arrangement $A_3$. In addition, at this last-mentioned variable-gain amplifier arrangement $A_3$ and also at the controllable input stage $A_0$ the common emitter lead is not coupled to an output terminal.

The full-wave rectification in $A_1$ and $A_2$, the 90°-phase shift at the output $V_1$, $\bar{V}_1$ of $A_1$ and forming the difference in the differential stage $DA_1$ are important for forming the second harmonic of the fundamental wave. The full-wave rectification in $A_1$ produces at the rectifier output $V_0^2$ not only the desired second harmonic but also an unwanted direct current component and unwanted higher even harmonics $(2K+1)$, wheren $K = 1, 2, 3, \ldots$ times the frequency of the fundamental wave. This not only holds for an undisturbed sinusoidal fundamental wave but also when this wave is disturbed by higher odd harmonics owing to non-linearities in preceding circuits. The full-wave rectification in $A_2$ of the fundamental wave, which is shifted through 90°, and its possible higher odd harmonics results at the rectifier output $V_1^2$ inter alia in a d.c. component and higher even harmonics at 4K wherein K=1, 2, 3, . . . times the frequency of the fundamental wave, which are equally large and in-phase with the corresponding components and harmonics, respectively in the output signal at $V_0^2$. By subtracting the output signals of $A_1$ and $A_2$ from each other at $V_0^2$ and $V_1^2$ in the differential stage $DA_1$ these in-phase components and harmonics, respectively, cancel each other out. Only the desired second harmonics, which are in antiphase relative to each other and unwanted higher even harmonics at (4K+2) wherein K=1, 2, 3, . . . times the frequency of the fundamental wave, are added together in the differential stage $DA_1$, these last-mentioned unwanted harmonics having an amplitude which is much smaller than the harmonics which compensate each other in the differential stage and as regards their frequency are located much further from the desired second harmonics. Consequently, if necessary, a still further reduction of the remaining harmonic distortion which in itself is very low can be realized in a simple way, using weakly selective filters.

For a correct difference formation in the differential stage $DA_1$ the full-wave rectified fundamental waves at $V_0^2$ and $V_1^2$ must also have equal amplitudes, that is to say the gain of $A_1$ must be equal to unity at the frequency of the fundamental wave. Because of process inaccuracies and variable ambient factors it is advantageous to stabilize the gain of $A_1$ adaptively to unity. In the embodiment shown this is accomplished by adjusting the gain of the fundamental wave in each of the circuits $A_0$-$A_3$ to one by means of negative feedback of the amplitude difference between the fundamental wave at the output $V_0$, $\overline{V}_0$, of $A_0$ and the fundamental wave at $V_2$, $\overline{V}_2$ of $A_2$ to the respective control inputs $CI_0$-$CI_3$ of said circuits $A_0$-$A_3$. Because of the 90°-phase shift at the output, $V_1$, $\overline{V}_1$ of $A_1$ and the further 90°-phase shift at the output $V_2$, $\overline{V}_2$ of $A_2$ these two fundamental waves have mutually opposite phases, so that mutually comparable amplitude values are obtained with the aid of a simple instantaneous amplitude detection, which values can be subtracted from each other by simply forming the difference. To that end the output $V_0$, $\overline{V}_0$ of $A_0$ and the output $V_2$, $\overline{V}_2$ of $A_2$ are coupled to first and second amplitude detectors $AD_1$ and $AD_2$, respectively and the outputs of these two amplitude detectors $AD_1$ and $AD_2$ are coupled to a differential input of a differential stage $DA_2$. The differential stage $DA_2$ applies the desired control signal to the control inputs $CI_1$-$CI_3$ of the circuits $A_0$-$A_3$ via a low-pass filter $LP_2$, which control signal causes the gain of $A_0$-$A_3$ to decrease at a positive amplitude difference, that is to say when the amplitude of the fundamental wave at the output $V_2$, $\overline{V}_2$ of $A_2$ exceeds the amplitude at the output $V_0$, $\overline{V}_0$ of $A_0$, and to increase in the opposite case.

Because of the predominantly first-order low-pass characteristic of each of the circuits $A_0$-$A_3$ and the requirements that the gain is equal to unity and, at least relative to $A_1$ and $A_2$, a 90°-phase shift at the frequency of the fundamental wave the d.c. gain in the circuits $A_0$-$A_3$ can be very large. As a result thereof, direct current error components owing to signal unbalance and/or DC-Offset in the circuits can be amplified to such an extent that, at low values, they seriously disturb the balanced setting of said circuits and consequently the operation of the frequency-doubling circuit. In the frequency-doubling circuit shown in FIG. 1 such balance-setting disturbances can be prevented by means of said direct current negative feedback loop, in which the direct current error components passing through the low-pass filter $LP_1$ can be fedback negatively to the input of the controllable input stage $A_0$ via the subtracting stage S and be suppressed thus.

Figure 3:
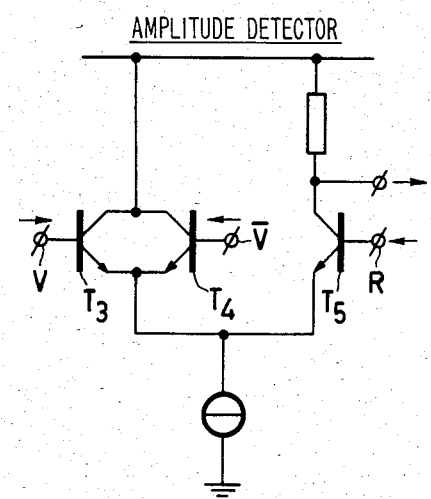
FIG. 3 shows an amplitude detector for use in the frequency-doubling circuit according to the invention.

So as to obtain at the outputs of the two amplitude detectors $AD_1$ and $AD_2$, which have mutually the same circuit configuration, a reliable measure of the amplitude of the fundamental wave applied thereto, each of these amplitude detectors comprises a differential amplifier of a structure as shown in FIG. 3. This structure comprises a parallel pair of transistors $T_3$, $T_4$ which are interconnected by means of their collectors and their emitters and effect full-wave rectification of the balanced fundamental wave applied to the bases V, $\overline{V}$. The direct current component of the fundamental wave thus rectified at the common emitter is a measure of the fundamental amplitude so that this parallel pair of transistors $T_3$, $T_4$ acts as an amplitude detector. The further, in this respect unwanted, higher even harmonics are suppressed by the low-pass filter $LP_2$ after difference formation in the differential stage $DA_2$. The parallel pair of transistors $T_3$, $T_4$ is connected to a supply voltage via the common collector lead and forms together with an emitter-coupled transistor $T_5$ a differential amplifier having the bases V, $\overline{V}$ of $T_3$, $T_4$ as one input and the base of $T_5$ as the other input. Then, the common emitter lead is connected to ground via a constant emitter current source and the output of this differential amplifier is constituted by the collector of $T_5$, which is connected to the supply voltage via a load resistor.

At the centre tap $R_2$ of the bridge resistor $2R_z$ of $A_0$ or $A_2$ a base biasing voltage is produced which, at a certain reference amplitude (for example 100 $mV_{rms}$) of the balanced fundamental wave applied to the bases of $T_3$, $T_4$, keeps the amplitudes of the differential voltages produced at the outputs of amplitude detectors $AD_1$ and $AD_2$ in the balanced condition. That bias voltage is applied to the base of the transistor $T_5$. As will be obvious from the foregoing, said base biasing voltage can be adjusted to the desired value by a chosen ratio between $R_x$ and $R_y$ in the circuit of FIG. 2. If the amplitude of the balanced fundamental wave at the bases of $T_3$, $T_4$ decreases, then the collector output voltage of $T_5$ will deviate in the negative sense from its balance setting value and vice versa. The variation of the collector output voltage of $T_5$ around this balanced setting value is rather linear and is not disturbed by a signal unbalance or DC-offset in the preceding circuits.

It will be obvious that the invention is not limited to the embodiment shown. Thus, it is quite possible, to implement the invention by directly detecting the amplitude of the phase-quadrature fundamental waves at the input and at the output of the first variable-gain amplifier arrangement with the aid of signal-integrating amplitude detectors. In addition, it is conceivable to use an unbalanced construction and to realize the functions of the circuits of FIG. 2 in a manner different from the manner described in the foregoing.

What is claimed is:

1. In a frequency-doubling circuit for doubling the fundamental frequency of a signal wave, such circuit comprising first and second full-wave rectifier circuits to which the signal wave is applied in mutual phase-quadrature and having outputs at which they produce rectified signals which are subtracted from each other to obtain the second harmonic of the fundamental frequency of the signal wave, the improvement characterized in that:

said first full-wave rectifier circuit comprises a first variable-gain amplifier having an input to which the signal wave is applied and an output which is capacitively loaded to produce a 90°-phase shift at the fundamental frequency, said first variable-gain amplifier further having a control input for controlling the gain factor thereof, the output of said first variable-gain amplifier being coupled to the input of said second full-wave rectifier circuit;

said frequency-doubling circuit further comprises:

first and second amplitude detectors each having inputs and an output, an input of the first amplitude detector being coupled to the input of the first variable-gain amplifier and an input of the second amplitude detector being coupled to the output of the second full-wave rectifier circuit; and a first differential amplifier having inputs respectively coupled to the outputs of the first and second amplitude detectors and having an output coupled to the control input of the first variable-gain amplifier for supplying a negative feedback control signal thereto which adaptively maintains the gain factor of the first variable-gain amplifier at unity at said fundamental frequency.

2. A frequency-doubling circuit as claimed in claim 1, further characterized in that said second full-wave rectifier circuit comprises a second variable-gain amplifier the output of which is capacitively loaded to produce a further 90°-phase shift of the fundamental wave, said second variable-gain amplifier having a control input for controlling the gain factor thereof; and the output of said first differential amplifier is coupled to the control input of each of said first and second variable-gain amplifiers by a low-pass filter; whereby the negative feedback control signal produced at output of said first differential amplifier adaptively maintains the gain factors of both variable-gain amplifiers at unity at said fundamental frequency.

3. A frequency-doubling circuit as claimed in claim 2, further characterized in that the first and second variable-gain amplifiers each comprise a pair of transistors connected in balanced long-tail configuration to a common emitter terminal, such common emitter terminal being connected to a current source having a control terminal which constitutes the control input of such variable-gain amplifier; such balanced pair of transistors being adapted to produce at their common emitter terminal a full-wave rectified signal from said signal wave; and further comprising a second differential amplifier coupled to the common emitter terminal of the balanced pair of transistors of each of said first and second variable-gain amplifiers, the balanced pair of transistors of the first variable-gain amplifier being arranged in cascade with the balanced pair of transistors of the second variable-gain amplifier, each of such pairs of transistors having capacitive input and output impedances.

4. A frequency-doubling circuit as claimed in claim 3, further comprising an input stage preceding the first-variable gain amplifier and which, in conjunction with the capacitive input impedance of the pair of transistors comprised in such amplifier, provides an at least partial selection of the fundamental frequency of the signal wave applied to the frequency-doubling circuit.

5. A frequency-doubling circuit as claimed in claim 4, further characterized in that said input stage comprises a pair of transistors connected in balanced long-tail configuration to a common emitter terminal, such common emitter terminal being connected to a current source having a control terminal which is coupled to the output of said first differential amplifier by the low pass filter; said input stage having an output which is connected to a further input of said first amplitude detector and said second variable-gain amplifier having an output which is connected to a further input of said second amplitude detector, whereby the amplitude detection characteristic of each of said amplitude detectors is symmetrically established around a predetermined reference value.

6. A frequency-doubling circuit as claimed in claim 5, further comprising a third variable-gain amplifier which comprises a pair of transistors connected in balanced long-tail configuration to a common emitter terminal, such common emitter terminal being connected to a current source having a control terminal which is connected to the output of said first differential amplifier, the input of said third variable-gain amplifier being connected to the output of the second variable-gain amplifier.

7. A frequency-doubling circuit as claimed in any one of claims 2–6, further comprising a direct current negative feedback loop from the output of the second variable-gain amplifier to the input of the first variable-gain amplifier.

* * * * *